United States Patent
Kermani

[19]

[11] Patent Number: 6,153,506
[45] Date of Patent: Nov. 28, 2000

[54] INTEGRATED CIRCUIT HAVING REDUCED PROBABILITY OF WIRE-BOND FAILURE

[75] Inventor: Bahram Ghaffarzadeh Kermani, Whitehall, Pa.

[73] Assignee: Lucent Technologies Inc., Murray Hill, N.J.

[21] Appl. No.: 09/263,075

[22] Filed: Mar. 8, 1999

[51] Int. Cl.[7] .......................... H01L 21/44; H01L 21/48; H01L 21/50; H01L 29/40
[52] U.S. Cl. ..................... 438/617; 438/123; 438/612; 438/666; 257/784; 257/786
[58] Field of Search ..................... 438/612, 666, 438/110, 123, 617; 257/784, 786, 666

[56] References Cited

U.S. PATENT DOCUMENTS 5,168,368  12/1992  Gow .......................................... 257/666

*Primary Examiner*—Charles Bowers
*Assistant Examiner*—Nema Berezny
*Attorney, Agent, or Firm*—William H. Bollman

[57] ABSTRACT

The present invention provides an improved integrated circuit technique for increasing the reliability of wire-bonds in an integrated circuit by increasing the contact angle between certain pins and their respective wire-bonds, particularly those pins otherwise most susceptible to wire-bond failure, i.e., those pins conventionally located toward the corners of a conventional integrated circuit. By doing so, the overall length of the wire-bonds in a chip will be reduced, which in turn can result in further reduction of the probability of wire-bond failures. In a disclosed embodiment, a five or more sided integrated circuit shape is introduced wherein pads on up to four sides of an integrated circuit wafer chip are bonded to pins supported on eight edges of an integrated circuit package. An integrated circuit having at least five pin-supporting edges renders more robust wire-bond angles for any given integrated circuit package size.

10 Claims, 5 Drawing Sheets

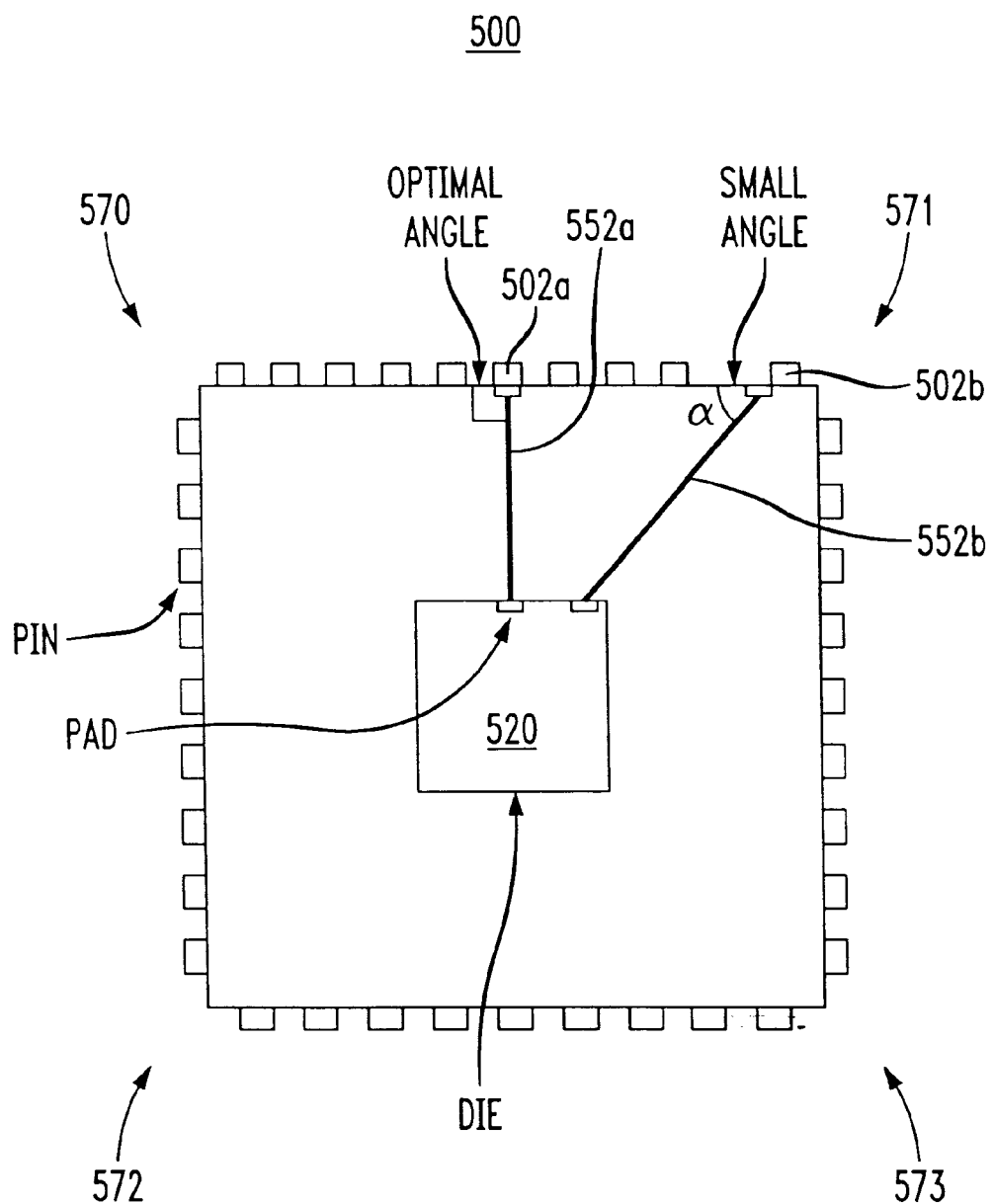

INTEGRATED CIRCUIT HAVING REDUCED PROBABILITY OF WIRE-BOND FAILURE

BACKGROUND OF THE INVENTION

1. Field of the Invention

This invention relates generally to integrated circuits. More particularly, it relates to the design of a package shape improving the reliability of wire-bonds between an integrated circuit wafer chip and the input/output (I/O) pins of a packaged integrated circuit.

2. Background of Related Art

Wire-bond failure at the pin level in integrated circuits is an important concern. An integrated circuit can be rendered non-functional with even a single wire-bond failure.

Integrated circuit wafer chips (i.e., "dies") are very small devices, often comprising tens or hundreds of thousands of transistors and other devices within an area much smaller than a dime. While many of the circuit connections are internal within an integrated circuit, it is also necessary to connect some of the internal wires with signals from external sources/sinks, e.g., with signals to and/or from other integrated circuits, with a power source, etc. Typically, electrical pads are formed on the outer perimeter of the integrated circuit, and very small wires are bonded between each of the electrical pads and an assigned pin in a wire frame ultimately forming the external pins of an integrated circuit. After the integrated circuit wafer chip (i.e., the die) is wire-bonded to the pins, the die and the wire-bonds are sealed and protected in a hermetically sealed plastic or ceramic encasement. After encasement, the external pins are cut away from a supporting frame and shaped into the desired form, e.g., straight down or out for mounting in through-hole printed circuit board applications, or bent into a "J" or "L" shape for surface-mount applications.

The wire-bonding between the various pads on the integrated circuit wafer chip and the pins is a delicate process, either performed by hand for small-volume productions, or performed by machine to fulfill high-volume needs.

The flexibility of the wire-bonds allow some expansion and contraction of the different materials (i.e., between the steel of the pins vs. the semiconductor material of the integrated circuit wafer chip). Unfortunately, flexible wire-bonds are extremely fragile. For instance, wire-bonds are typically formed of bare wire and as such must not touch an adjacent flexible wire-bond or a short circuit would be caused between adjacent pins of the integrated circuit. Moreover, the flexible wire bonds are very thin and thus are easily broken. In some instances, multiple wire bonds are formed between a particular pad area and the desired pin, multiple pins may be used, or a thicker wire-bond may be used, to provide added reliability and/or to reduce a resistance between the relevant pad of the integrated circuit wafer and its pin.

It is desirable to minimize the overall size of a packaged integrated circuit. Thus, integrated circuits having a significant number of external pins are typically formed on all four sides of the rectangular (or square) hermetically sealed package. The greater the number of necessary external electrical connections, the larger the package.

FIG. 4 depicts the pins 502 of a conventional rectangular (or square) integrated circuit package 500 bonding with respective wire-bonds 552 to relevant pads on an integrated circuit wafer chip in a central portion 520.

In particular, various electrical pads of a relevant integrated circuit wafer chip are wire-bonded with point-to-point wire-bonds 552 to the inner ends of respective pins 502 formed on the four sides of an integrated circuit package 500. Afterwards, the integrated circuit wafer chip 520, wire-bonds 552 and inner portions of the pins 502 are hermetically sealed with a plastic or ceramic encasement to protect the wire-bonds as well as the integrated circuit wafer chip itself. Thereafter, the pins 502 are appropriately formed, e.g., into a surface mount or through-hole type configuration, and a supporting outer frame holding the pins 502 in place during the wire-bonding and packaging process is cut off, resulting in a completed integrated circuit ready for final testing and inclusion into a printed circuit board.

Packaging yield is directly proportional to the success of the wire-bonding of the various pads on the integrated circuit wafer chip (i.e., die) 520 to the I/O pins 502. If any one wire-bond 552 fails (e.g., breaks or shorts to another wire-bond 552), it is likely that the entire integrated circuit device will fail. Moreover, it is unlikely in most cases that such an integrated circuit wafer chip can be recovered for re-work, particularly after it is encased, partly due to the frailty of the integrated circuit wafer chip 520 and wire-bonds 552, and partly because the labor required to perform such re-work typically costs much more than the value of the failed device.

Some amount of the success of wire-bonding is due at least in part to the angle of the individual pins 502 with respect to the bonding wire-bond 552. However, conventional rectangular-shaped integrated circuits can potentially result in small wire-bond contact angles with respect to the pins 502, particularly toward the corners 570–573 of the integrated circuit.

Thus, rectangular integrated circuit packages can potentially result in small wire-bond contact angles, which may become undesirable. Conventionally, if the contact angle becomes smaller than a certain lower limit, the size of the overall integrated circuit is increased to accommodate the smaller distances between wire-bonds.

FIG. 5 shows a conventional rectangular integrated circuit 500 as shown in FIG. 4, but with an emphasis placed on two exemplary pins 502a and 502b, and their corresponding wire-bonds 552a and 552b.

Optimally, the angle of any particular pin 502 with respect to the bonding wire-bond 552 is 90°. For instance, the central pin 502a as shown in FIG. 5 enjoys this optimal angle with its wire-bond 552a forming a 90° angle with respect to an edge of the integrated circuit whereon the pins 502 are mounted. However, most pins do not enjoy this optimal angle.

For instance, the pins toward the corners 570–573 of the integrated circuit 500 require the formation of a smallest angle α between the side of the integrated circuit 500 on which the relevant pin, e.g., 502b is mounted, and its bonding wire-bond 552b. The angles with respect to the pins between the optimal pin 502a and the pin suffering the smallest angle α gradually stray from the optimal 90° angle to the smallest angle α. As this angle decreases, the probability of failure of the relevant wire-bond 552 increases. The particular wire-bond 552 may fail either when the wire-bonding is performed, or even after a period of time due to material exhaustion.

There is a need for an improved integrated circuit technique which reduces the possibility of wire-bond failure, particularly with respect to pins conventionally located towards the corners of a conventional rectangular-shaped integrated circuit.

SUMMARY OF THE INVENTION

In accordance with the principles of the present invention, a wire-bonded integrated circuit comprises an integrated circuit wafer chip consisting of four bonding edges. An encasement includes at least five edges supporting a plurality of I/O pins. A plurality of wire-bonds electrically connect the integrated circuit wafer chip to the plurality of I/O pins.

A method of wire-bonding an integrated circuit in accordance with another aspect of the present invention comprises wire-bonding each of a plurality of pads on four edges of an integrated circuit wafer chip to respective pins supported over at least five edges of an encasement.

BRIEF DESCRIPTION OF THE DRAWINGS

Features and advantages of the present invention will become apparent to those skilled in the art from the following description with reference to the drawings, in which:

FIG. 5 shows a conventional rectangular integrated circuit as shown in FIG. 4, but with an emphasis placed on two exemplary pins and their corresponding wire-bonds.

DETAILED DESCRIPTION OF ILLUSTRATIVE EMBODIMENTS

The present invention provides an improved integrated circuit having increasing reliability of wire-bond. In the integrated circuit, the contact angle between pins and their wire-bonds is increased in regions otherwise prone to wire-bond failure, i.e., in the corners of otherwise conventional integrated circuits.

In particular, a polygonal integrated circuit shape having at least five (5) pin supporting edges is introduced which provides a more optimum contact angle with respect to pins and their wire-bonds. While the disclosed embodiment relates particularly to an octagon-shaped integrated circuit package with a rectangular integrated circuit wafer chip, the principles of the present invention relate generally to any polygonal-shaped wire-bonding performed between pads on a rectangular integrated circuit chip wafer and at least five edges of a non-rectangular integrated circuit.

Figure 1:
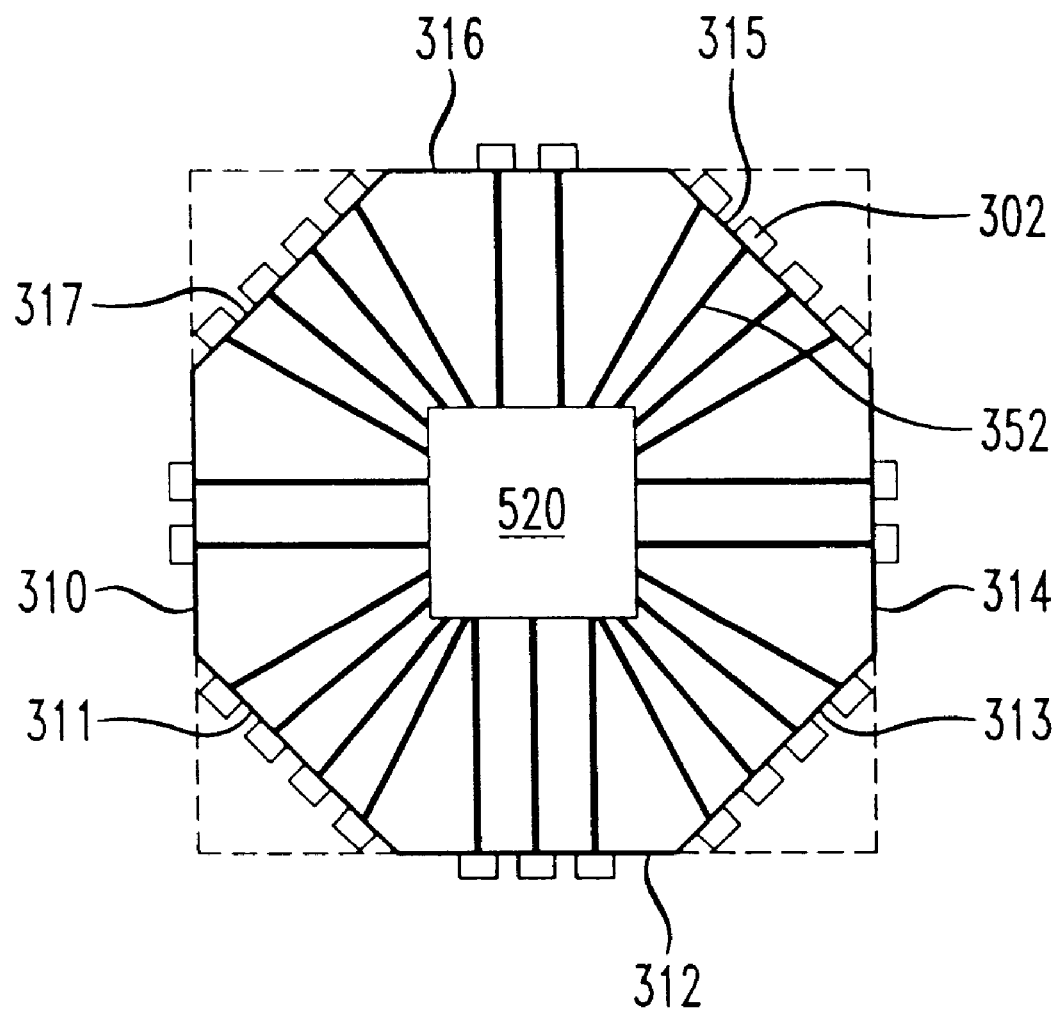
FIG. 1 shows an integrated circuit including a square integrated circuit wafer chip (i.e., a die), and a plurality of pins located along polygonal sides of the integrated circuit, in accordance with the principles of the present invention.

FIG. 1 shows an integrated circuit 300 including a square integrated circuit wafer chip (i.e., a die) 520, and a plurality of pins 302 located along polygonal sides of the integrated circuit 300, in accordance with the principles of the present invention.

Figure 4:
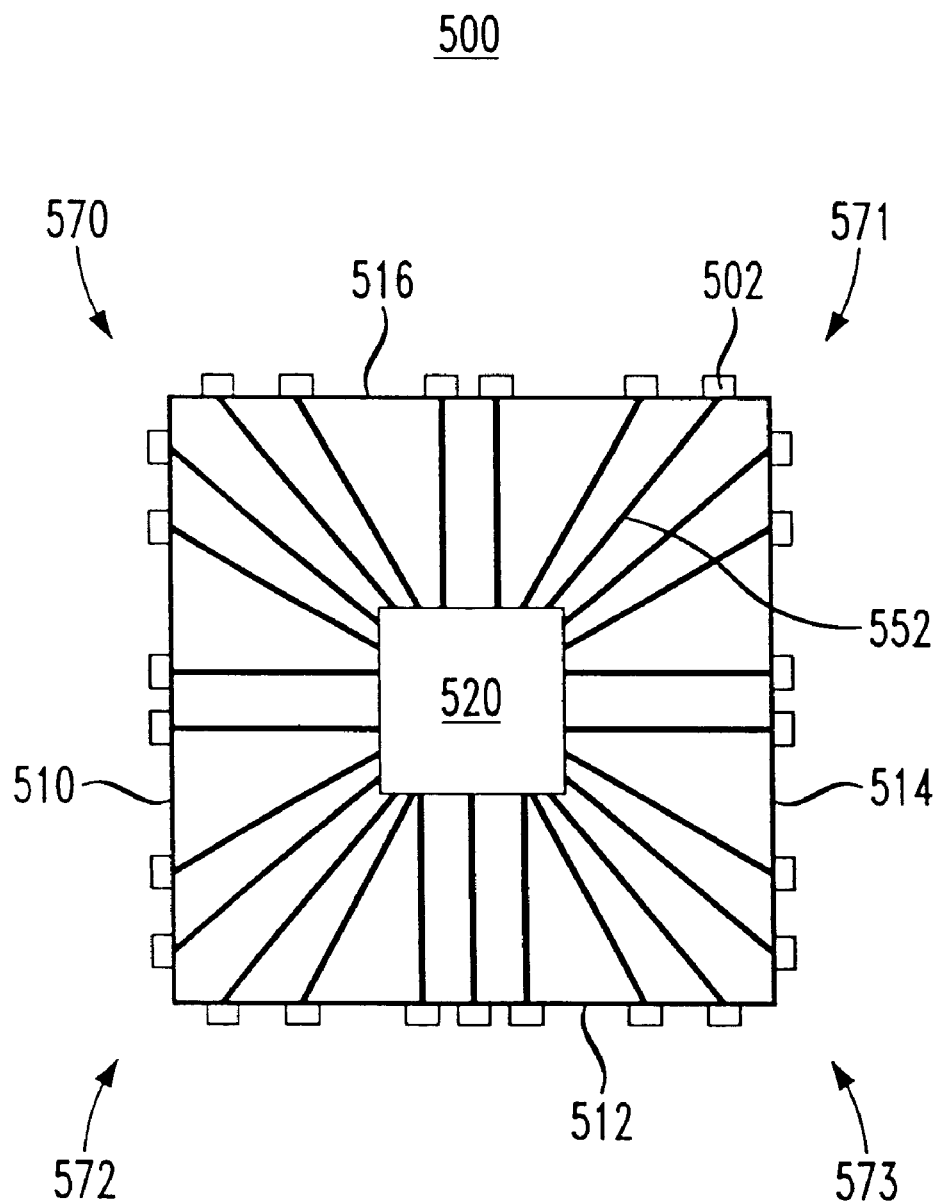
FIG. 4 depicts the pins of a conventional rectangular (or square) integrated circuit package bonding with respective wire-bonds to relevant pads on an integrated circuit wafer chip in a central portion.

Use of more than four substantially straight outer supporting portions 310–317 of the integrated circuit 300 increases the wire-bond angles between those pins 302, which would otherwise be formed toward a corner of a conventional rectangular-shaped wire-bond frame (e.g., 500 as shown in FIG. 4), and outer supporting portions 310–317 closer toward the optimum of 90°, thus reducing the possibility of wire-bond failure with respect to those pins enjoying improved angles.

Figure 2:
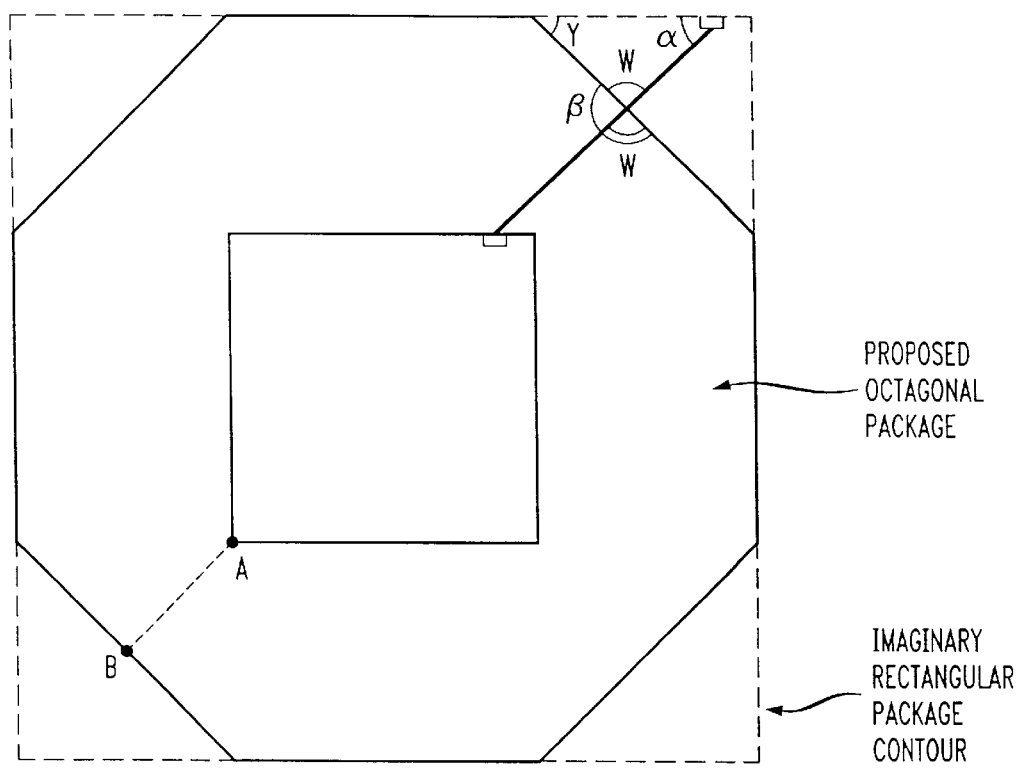
FIGS. 2 and 3 show the development of a relationship between the size of the die and the octagonal size of the integrated circuit package.

The proof is as follows with respect to an octagonal-shaped integrated circuit for the non-coincidental portions of the octagonal-shaped integrated circuit and an imaginary rectangular package contour as shown in FIG. 2.

Assume that the contact angle between the relevant portion of a supporting perimeter of an octagonal-shaped integrated circuit (having at least five sides) and pins 302 is $\alpha$. By increasing the number of outer supporting perimeters of the integrated circuit 300 from the conventional four (forming a rectangle) to, e.g., eight to form an octagon, the resultant wire-bond contact angles become $\beta=45°+\alpha$, as shown in FIG. 2.

Since in theory, the contact angle $\alpha$ can vary between 0° and 90°, by applying the above-referenced equation, $\beta$ can vary between 45° and 135°. Thus, since 90° is the ideal angle, the variation of $\beta$ can be rewritten as:

$\alpha+\omega+\gamma=180°$ (Triangle)

$\gamma=45°$ (Equilateral Octagon)

$\beta+\omega=180°\rightarrow\beta=180°-[180°-\alpha-\gamma]=\alpha+\gamma\rightarrow\beta=\alpha+45°$ Ideal Angle$-45°<\beta<$Ideal Angle$+45°$ Therefore, a polygonal-shaped (e.g., an octagonal-shaped) wire-bonding pattern for an integrated circuit renders more robust wire-bond angles for any given integrated circuit package size.

Figure 3:
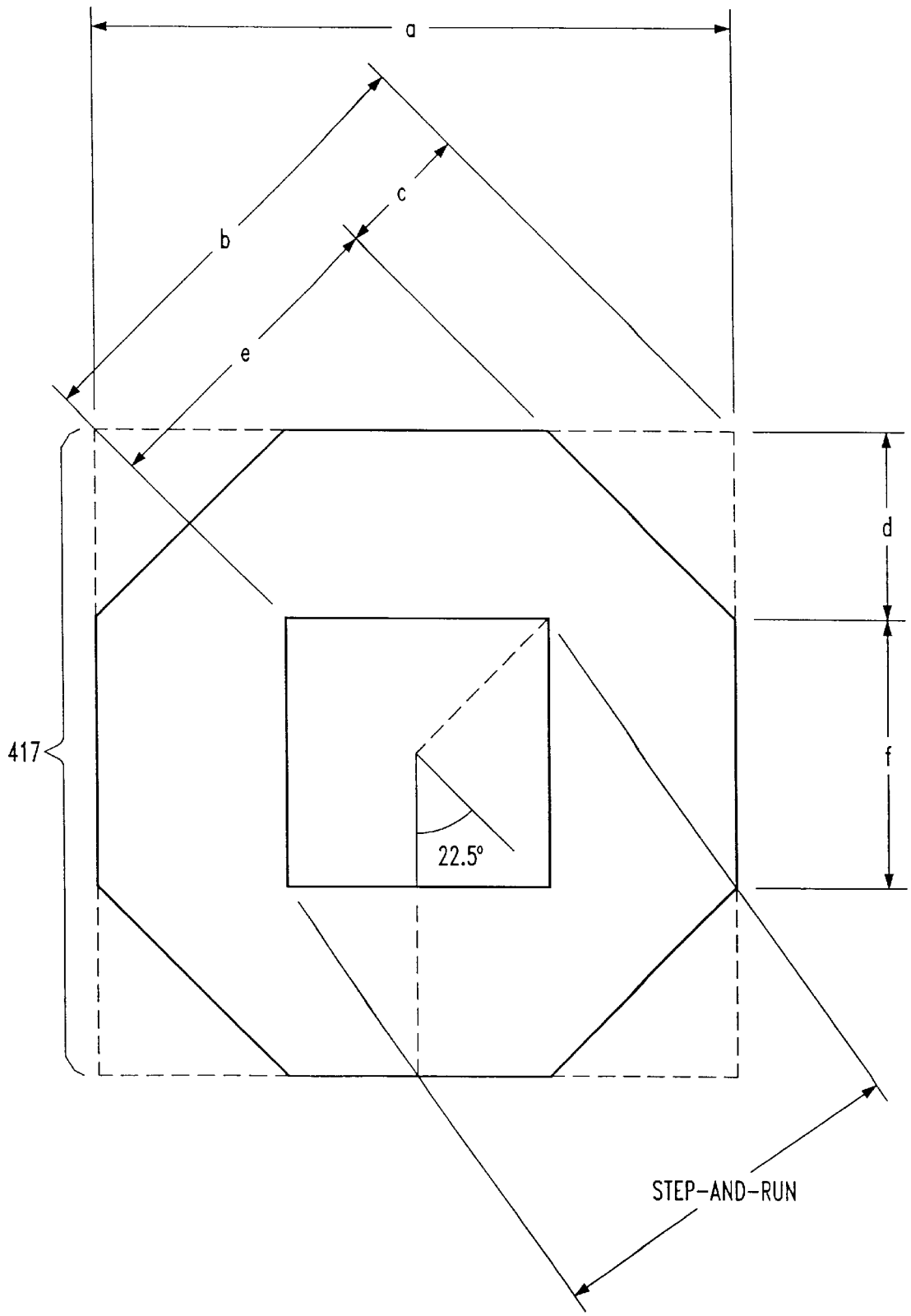

FIGS. 2 and 3 show the development of a relationship between the size of the die and the octagonal size of the integrated circuit package.

In particular, it should be noted that the above-calculations are true as long as the integrated circuit 300 does not intersect with the polygonal-shaped bonding perimeter of the pins 302. In other words, point A should not extend beyond point B as shown in FIG. 2.

FIG. 3 shows a conclusion that the "step and run" of the die 520 should be less than the length of the edge 417 of an imaginary square formed by every other edge of the octagonal shape of the integrated circuit 300.

Calculations relevant to the dimensions shown in FIG. 3 arriving at the conclusion that the "step and run" of the die 520 should be less than the length of the edge 417 of an imaginary square formed by every other edge of the octagonal shape of the integrated circuit 300 are shown herein below:

$$e = b - c$$

$$(2b)^2 = 2a^2 \Rightarrow b = \frac{1}{\sqrt{2}}a$$

$$2c^2 = d^2 \Rightarrow c = \frac{1}{\sqrt{2}}d$$

$$d = \frac{a-f}{2}$$

$$\Rightarrow c = \frac{1}{\sqrt{2}}\frac{a-f}{2}$$

$$\frac{f}{2} = \frac{a}{2}\tan(22.5°) \Rightarrow f = a\tan(22.5°)$$

$$c = \frac{1}{\sqrt{2}}\left(\frac{a - a\tan(22.5°)}{2}\right)$$

$$e = \frac{1}{\sqrt{2}}a - \frac{1}{\sqrt{2}}a\left(\frac{1 - \tan(22.5°)}{2}\right)$$

$$e = \frac{1}{\sqrt{2}}a\frac{1 + \tan(22.5°)}{2}$$

-continued $$e = \frac{\sqrt{2}}{4}(1 + \tan(22.5°))a \Rightarrow e \cong 0.5a$$

$$e = \frac{1}{2} step\_and\_run\_of\_die$$

Thus, the step and run of the die is preferably smaller than the edge of the imaginary square.

In addition to improving the angles as described above, the probability of failure of conventional wire-bonds (i.e., from a rectangular die to pins along an outer perimeter having at least five sides) will decrease further due to the reduction in the total length of wire-bonds provided by the principles of the present invention. More specifically, as compared to wire-bonds between a given sized conventional rectangular shaped die to pins along an outer perimeter having at least five (5) sides does not need to increase the overall wire-bond length. In fact, as compared to a given sized conventional rectangular shaped integrated circuit package, an octagonal-shaped integrated circuit can result in a reduction in the overall length of the wire-bonds at the edges of the integrated circuit package because the wire-bonds that were otherwise bonded to pins in the corners of the integrated circuit package can be bonded with shorter lengths at the edges of the octagon, in accordance with the principles of the present invention. Thus, $$\Sigma \text{wire-bond lengths}_{octagon} < \Sigma \text{wire-bond lengths}_{rectangle}$$

The octagonal-shaped integrated circuit 300 is particularly useful for surface mounting wherein the extremities of each of the pins 302 would be bent, e.g., into a "J" or "L" shape on the outside of the hermetically sealed plastic or ceramic package. However, the principles of the present invention relate equally to through-hole mount or hybrid integrated circuit applications.

While the invention has been described with reference to the exemplary embodiments thereof, those skilled in the art will be able to make various modifications to the described embodiments of the invention without departing from the true spirit and scope of the invention.

What is claimed is:

1. A method of wire-bonding an integrated circuit, comprising:

wire-bonding each of a plurality of pads on at least one edge of a rectangular integrated circuit wafer chip having only four edges to respective pins of a plurality of pins, wherein said plurality of pins are supported by at least one of five edges of an encasement.

2. The method of wire-bonding an integrated circuit according to claim 1, wherein:

said pads on said four edges of said integrated circuit wafer chip are wire-bonded to respective pins along at least eight edges of said encasement.

3. The method of wire-bonding an integrated circuit according to claim 1, wherein:

said encasement is octagonal-shaped, and said pads on said four edges of said integrated circuit wafer chip are wire-bonded to respective pins along eight edges of said octagonal-shaped encasement.

4. The method of wire-bonding an integrated circuit according to claim 1, further comprising:

determining a length of one of said at least five edges of said encasement such that a step-and-run length of the integrated circuit wafer chip is less than a length of one side of an imaginary square enclosing said at least five edges of said encasement.

5. The method of wire-bonding an integrated circuit according to claim 4, wherein:

said encasement is octagonal-shaped.

6. The method of wire-bonding an integrated circuit according to claim 1, wherein:

said step of wire-bonding comprises:

forming a resultant wire-bonding contact angle $\beta$ between a wire and one of said at least five edges of said encasement, wherein said resultant wire-bonding contact angle $\beta$ equals $\alpha+45°$, where $\alpha$ is a contact angle which would have formed between said wire and one side of an imaginary square enclosing said at least five edges of said encasement.

7. The method of wire-bonding an integrated circuit according to claim 6, wherein:

said resultant wire-bonding contact angle $\beta$ is greater than 45° and less than 135°.

8. The method of wire-bonding an integrated circuit according to claim 1, further comprising:

bending at least one of said pins into a J shape outside said encasement.

9. The method of wire-bonding an integrated circuit according to claim 1, further comprising:

bending at least one of said pins into a L shape outside said encasement.

10. The method of wire-bonding an integrated circuit according to claim 1, further comprising:

said step of wire-bonding comprises:

determining lengths of respective wires between said plurality of pads and said pins supported over said at least five edges of said lead frame such that a sum of a length of each of said respective wires is less than a sum of each of lengths of respective wires that would be required if said lead frame had less than five edges.

* * * * *